(12) United States Patent
Yoshii et al.

(10) Patent No.: US 12,274,103 B2
(45) Date of Patent: Apr. 8, 2025

(54) ELECTRONIC DEVICE AND MANUFACTURING METHOD THEREFOR

(71) Applicant: Murata Manufacturing Co., Ltd., Nagaokakyo (JP)

(72) Inventors: Kentaro Yoshii, Nagaokakyo (JP); Koji Matsushita, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 735 days.

(21) Appl. No.: 17/462,504

(22) Filed: Aug. 31, 2021

(65) Prior Publication Data

US 2021/0399178 A1 Dec. 23, 2021

Related U.S. Application Data

(63) Continuation of application No. PCT/JP2020/000839, filed on Jan. 14, 2020.

(30) Foreign Application Priority Data

May 30, 2019 (JP) ................................. 2019-101308

(51) Int. Cl.
  *H01L 33/00* (2010.01)
  *H10H 20/85* (2025.01)
  *H10H 20/01* (2025.01)

(52) U.S. Cl.
  CPC ....... *H10H 20/8506* (2025.01); *H10H 20/036* (2025.01)

(58) Field of Classification Search
  CPC ...................... H01L 2933/0033; H01L 33/483
  See application file for complete search history.

(56) References Cited

U.S. PATENT DOCUMENTS

| 8,716,736 | B2* | 5/2014 | Yamae ................. | H10K 50/841 |
| | | | | 257/E33.056 |
| 2007/0108461 | A1* | 5/2007 | Shiraishi ............... | H01L 33/507 |
| | | | | 257/E33.072 |
| 2016/0093781 | A1 | 3/2016 | Tamaki et al. | |
| 2017/0112952 | A1* | 4/2017 | Kato ......................... | A61L 2/10 |

(Continued)

FOREIGN PATENT DOCUMENTS

| JP | H09241040 A | 9/1997 |
| JP | 2001308519 A | 11/2001 |

(Continued)

OTHER PUBLICATIONS

International Search Report issued for PCT/JP2020/00839, date of mailing Mar. 24, 2020.

(Continued)

*Primary Examiner* — Hoa B Trinh
(74) *Attorney, Agent, or Firm* — ArentFox Schiff LLP

(57) ABSTRACT

An electronic device that includes a base member made of a material containing metal atoms, the base member having a bonding surface, and the bonding surface contains oxides of the metal atoms; an electronic element is mounted on the base member; an organic structure on the bonding surface of the base member; and a cover member bonded to the bonding surface of the base member via the organic structure so as to encapsulate the electronic element in a space between the base member and the cover member.

10 Claims, 5 Drawing Sheets

(56) References Cited

U.S. PATENT DOCUMENTS

| | | |
|---|---|---|
| 2017/0338382 A1 | 11/2017 | Park et al. |
| 2018/0040583 A1 | 2/2018 | Tamaki et al. |
| 2018/0219124 A1 | 8/2018 | Toita et al. |
| 2019/0221541 A1 | 7/2019 | Tamaki et al. |

FOREIGN PATENT DOCUMENTS

| | | |
|---|---|---|
| JP | 2004091319 A | 3/2004 |
| JP | 2011044533 A | 3/2011 |
| JP | 2014159535 A | 9/2014 |
| JP | 2016072471 A | 5/2016 |
| JP | 2017103351 A | 6/2017 |
| JP | 2018174207 A | 11/2018 |
| JP | 2019040996 A | 3/2019 |
| WO | 2017203795 A1 | 11/2017 |

OTHER PUBLICATIONS

Written Opinion of the International Searching Authority issued for PCT/JP2020/00839, date of mailing Mar. 24, 2020.

\* cited by examiner

ELECTRONIC DEVICE AND MANUFACTURING METHOD THEREFOR

CROSS REFERENCE TO RELATED APPLICATIONS

The present application is a continuation of International application No. PCT/JP2020/000839, filed Jan. 14, 2020, which claims priority to Japanese Patent Application No. 2019-101308, filed May 30, 2019, the entire contents of each of which are incorporated herein by reference.

FIELD OF THE INVENTION

The present disclosure relates to an electronic device and a manufacturing method therefor.

BACKGROUND OF THE INVENTION

Heretofore, a package structure in which an electronic element such as a light-emitting diode (LED) is encapsulated by a substrate and cover member is known. For example, below-listed Patent Document 1 discloses an ultraviolet light-emitting device in which a deep ultraviolet LED element is mounted inside a recess provided in a low-temperature co-fired ceramic (LTCC) substrate and the LTCC substrate and an ultraviolet light passing window member are bonded to each other by a resin adhesive layer. It is described in Patent Document 1 that aluminum nitride (AlN) can be used as the substrate material.

Patent Document 1: Japanese Unexamined Patent Application Publication No. 2017-103351

SUMMARY OF THE INVENTION

The bonding strength of ceramic materials such as LTCC and AlN with resin adhesives is comparatively weak, and therefore there is a problem in that there is a tendency for the window member to peel off from the substrate when a resin adhesive is used to bond the substrate and the window member to each other. On the other hand, when the substrate and the window member are bonded to each other using gold-tin (AuSn) for example, there is an increase in cost compared with when a resin adhesive is used.

The present disclosure was made in light of the above-described circumstances and it is an object thereof to provide an electronic device and a manufacturing method therefor that enable the bonding strength between a base member and a cover member to be improved while suppressing an increase in cost.

An electronic device according to an aspect of the present disclosure includes a base member made of a material containing metal atoms, the base member having a bonding surface, and the bonding surface containing oxides of the metal atoms; an electronic element mounted on the base member; an organic structure on the bonding surface of the base member; and a cover member bonded to the bonding surface of the base member via the organic structure so as to encapsulate the electronic element in a space between the base member and the cover member.

A method of manufacturing an electronic device according to an aspect of the present disclosure includes preparing a base member that is formed of a material containing metal atoms; mounting an electronic element on the base member; forming oxides by oxidizing the metal atoms at a bonding surface of the base member; providing an organic structure on the bonding surface of the base member; and encapsulating the electronic element in a space between the base member and the cover member by bonding the cover member to the bonding surface of the base member via the organic structure.

According to the present disclosure, an electronic device and a manufacturing method therefor can be provided that enable the bonding strength between a base member and a cover member to be improved while suppressing an increase in cost.

DETAILED DESCRIPTION OF THE PREFERRED EMBODIMENTS

Hereafter, an embodiment of the present disclosure will be described. In the following description of the drawings, identical or similar constituent elements are denoted by identical or similar reference symbols. The drawings are representative, the dimensions and shapes of the individual parts are schematically illustrated, and the technical scope of the invention of the present application should not be interpreted as being limited to that of the embodiment.

Figure 1:
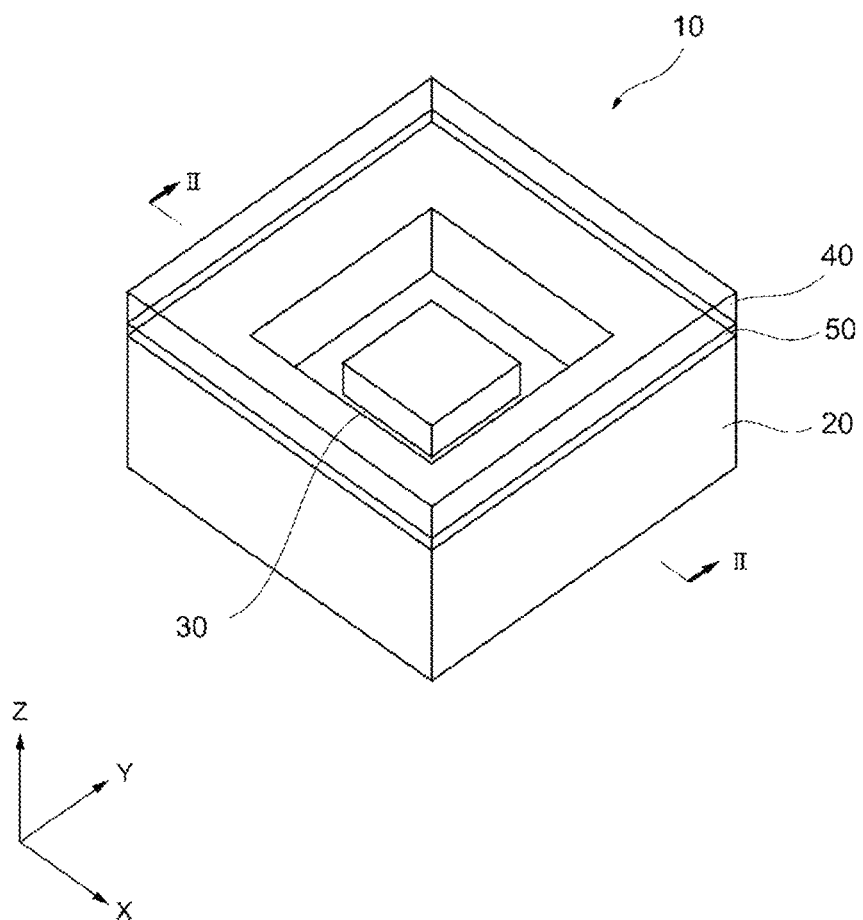
FIG. 1 is a perspective view of a light-emitting device according to an embodiment of the present disclosure.
Figure 2:
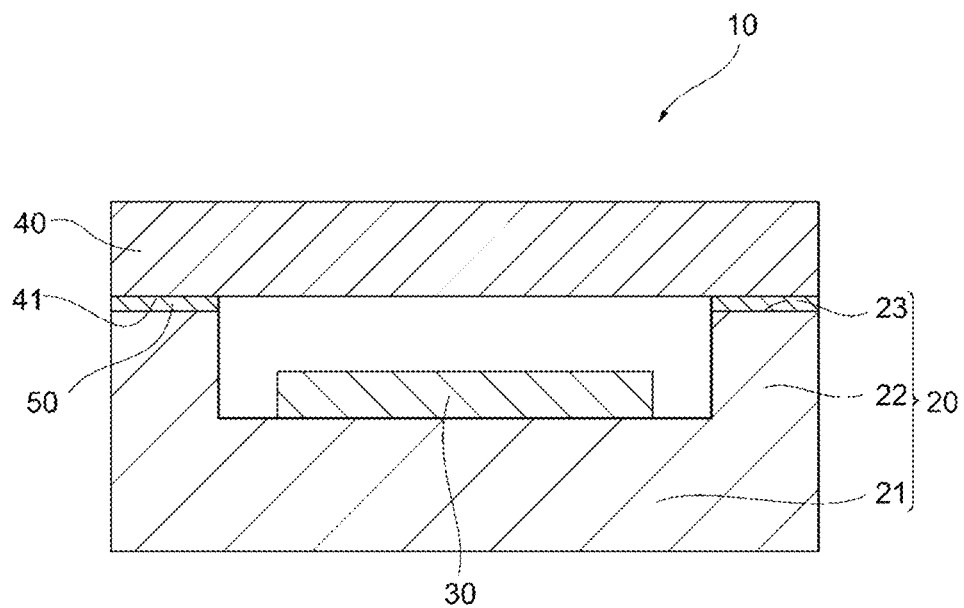
FIG. 2 is a sectional view taken along line II-II in FIG. 1.

A light-emitting device according to an embodiment of the present disclosure will be described while referring to FIGS. 1 and 2. FIG. 1 is a perspective view of the light-emitting device according to the embodiment of the present disclosure. FIG. 2 is a sectional view taken along line II-II in FIG. 1.

As illustrated in FIG. 1, a light-emitting device 10 according to this embodiment includes a base member 20, a light-emitting element 30, a cover member 40, and an organic structure 50. Hereafter, for convenience of description, each member is described using a Cartesian coordinate system of mutually perpendicular X-, Y-, and Z-axes, as illustrated in FIG. 1 and so on and this coordinate system of axes is unrelated to the crystal axes of each member.

The base member 20 has a recess that opens toward the cover member 40 and forms part of a holder for housing the light-emitting element 30. The base member 20 includes a mounting part 21 on which the light-emitting element 30 is mounted and a side wall part 22 that surrounds the mounting part. The mounting part 21 is a flat plate that faces the cover member 40 and has a pair of rectangular main surfaces that are parallel to a plane defined by the X axis and the Y axis (hereafter, also referred to as the XY plane. This similarly applies to the other planes). The side wall part 22 extends in a direction normal to the main surfaces of the mounting part 21 (Z axis direction) along the entire periphery of the opening of the base member 20. The side wall part 22 has a bonding surface 23 that faces the cover member 40 and to which the cover member 40 is bonded by the organic structure 50. The mounting part 21 and the side wall part 22 may be formed so as to be integrated with each other or may be individually formed.

In this embodiment, the base member 20 is formed of a material including aluminum. More specifically, the base member 20 is formed of an AlN substrate having aluminum nitride (AlN) as a main component. AlN is preferably used for the base member of the light-emitting device 10 because AlN has higher thermal conductivity and heat resistance than other ceramics, for example. The material of the base member 20 is not limited to this material and the base member 20 may be formed of another material containing metal atoms.

The light-emitting element 30 is mounted on a mounting surface of the mounting part 21 of the base member 20. Although not illustrated in detail in FIGS. 1 and 2, the light-emitting element 30 may be an LED, for example. The light-emitting element 30 is electrically connected to electrodes (not illustrated) provided on the mounting part 21 of the base member 20, and is electrically connected to outside the light-emitting device 10 through a metal via (not illustrated) provided in the mounting part 21, for example.

The wavelength of the light emitted by the light-emitting element 30 is not particularly limited, but may be deep ultraviolet light of a short wavelength region of around 210 to 310 nm, for example. When the light-emitting element 30 is a deep ultraviolet light LED, the light-emitting device 10 can be used for disinfection, sterilization, purification, and so forth, for example.

Together with the base member 20, the cover member 40 forms part of a holder for housing the light-emitting element 30. The cover member 40 is shaped like a flat plate and has a pair of rectangular main surfaces that are parallel to the XY plane. An annular shaped portion of the main surface on the side facing the base member 20 is bonded to the bonding surface 23 of the base member 20 by the organic structure 50. The shape of the cover member 40 is not particularly limited so long as the light-emitting element 30 can be housed in the internal space formed by the cover member 40 and the base member 20 when the cover member 40 is bonded to the base member 20.

The cover member 40 may be formed of an artificial crystal, for example. An artificial crystal has higher transmittance over a wider range of wavelengths than other materials such as glass, for example. Even when an artificial crystal transmits light having a comparatively short wavelength and high energy (for example, deep ultraviolet light), the optical characteristics of the crystal are unlikely to be impaired and the degradation of the crystal is slow. In addition, an artificial crystal has excellent durability due to not having deliquescency. The material of the cover member 40 is not particularly restricted so long as the material transmits the light emitted by the light-emitting element 30 therethrough, and other than an artificial crystal, for example, the cover member 40 may be formed of materials such as alumina, a ceramic such as glass containing alumina, a metal such as aluminum or copper, natural crystal, synthetic quartz, polycarbonate, polystyrene, diethylene glycol bisallyl carbonate, poly-4-methylpentene-1, dicyclopentanyl methacrylate, polymethyl methacrylate, fluorine-based epoxy resin, fluorine-based acrylic resin, sapphire, MgO, $MgF_2$, $CaF_2$, synthetic phased silica, and so on. The cover member 40 may be formed of a resin plate, sheet, or film containing resin, for example.

The organic structure 50 is provided along the entire periphery between the bonding surface 23 of the base member 20 and the main surface of the cover member 40. In this specification, the organic structure 50 is a structure that contains an organic material. For example, the organic structure 50 is a film or layer composed of an organic material and examples of the organic structure 50 include films and layers containing the organic material and an inorganic material such as a metal. The organic structure 50 has a function of bonding the base member 20 and the cover member 40 to each other. The cover member 40 is bonded to the bonding surface of the base member 20 via the organic structure 50, and as a result, the light-emitting element 30 is encapsulated in the internal space (cavity) enclosed by the base member 20 and the cover member 40.

Here, when the material of the base member 20 is a ceramic such as AlN, the bonding strength with a resin adhesive is comparatively weak and there is a risk of the cover member 40 peeling off from the base member 20. On the other hand, for example, when the cover member and the base member are bonded to each other using gold-tin, there is an issue that the cost is increased compared with a resin adhesive.

In order to solve this issue, in the light-emitting device 10 according to this embodiment, oxides are formed by modifying the bonding surface 23 of the base member 20 before bonding the base member 20 and the cover member 40 to each other. For example, in the case where the base member 20 is an AlN substrate, when the bonding surface 23 is modified, aluminum, which consists of metal atoms, is oxidized and aluminum oxide ($Al_2O_3$), which is an oxide, is formed. In other words, the bonding surface 23 becomes alumina. This makes it easier for hydroxyl groups (OH groups) to form on the bonding surface 23.

The bonding strength between the base member 20 and the organic structure 50 can be improved by using, as the organic structure 50, a resin adhesive that contains functional groups that react with the hydroxyl groups formed on the bonding surface 23 to form covalent bonds or that contains functional groups that form hydrogen bonds with the hydroxyl groups. For example, as disclosed in Japanese Unexamined Patent Application Publication No. 2014-159535, an adhesive that contains one or more of the following groups as functional groups may be used: an epoxy group, a silicone group, a vinyl group, a styryl group, a hydroxy group, a carboxyl group, a methacryloxy group, an acryloxy group, an amino group, an imino group, a cyano group, an amide group, an ureido group, an isocyanate group, and a siloxane group. In particular, it is preferable that an adhesive be used that contains a functional group having an oxygen atom or a nitrogen atom in a repeating structure thereof.

Specifically, for example, an epoxy resin adhesive, a silicone resin adhesive, a polyimide adhesive, a phenol resin adhesive, an acrylic resin adhesive, a fluorine resin adhesive, a polyphenylene ether resin adhesive, a polyamide adhesive, an acrylonitrile butadiene rubber (NBR) adhesive, a polyester adhesive, a polyester urethane adhesive, a urethane resin adhesive, a polyamideimide resin adhesive, a polyesterimide resin adhesive, a cyanoacrylate adhesive, a styrene-butadiene rubber adhesive, a nitrile rubber adhesive, a polymethacrylate resin adhesive, a urea resin adhesive, and so on can be used as the organic structure 50.

In particular, epoxy resin adhesives have epoxy groups containing oxygen atoms, and silicone resin adhesives have siloxane bonds containing oxygen atoms. Therefore, it is more preferable to use an epoxy resin adhesive or a silicone resin adhesive as the organic structure 50 due to the excellent adhesion with the bonding surface 23 where the hydroxyl groups are formed. Alternatively, a hybrid resin adhesive consisting of a mixture of an epoxy resin adhesive and a silicone resin adhesive may be used as the organic structure 50.

The organic structure 50 may be made thermally conductive or electrically conductive by mixing in an inorganic filler such as silica, alumina, or aluminum nitride, a metal powder, or a carbon-based material such as carbon black, carbon nanotubes, or graphene, for example.

The method used to oxidize the bonding surface 23 of the base member 20 is not especially limited, but, for example, a method in which the bonding surface 23 is irradiated with laser light using a laser in an environment that contains oxygen may be used. The environment containing oxygen may be the atmosphere, for example.

Figure 3A:
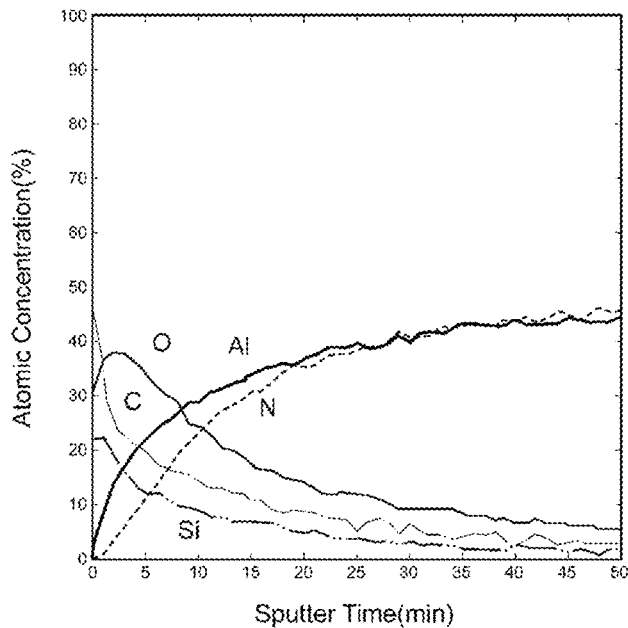
FIG. 3A is a graph illustrating the composition of a bonding surface of a base member prior to being irradiated with laser light.
Figure 3B:
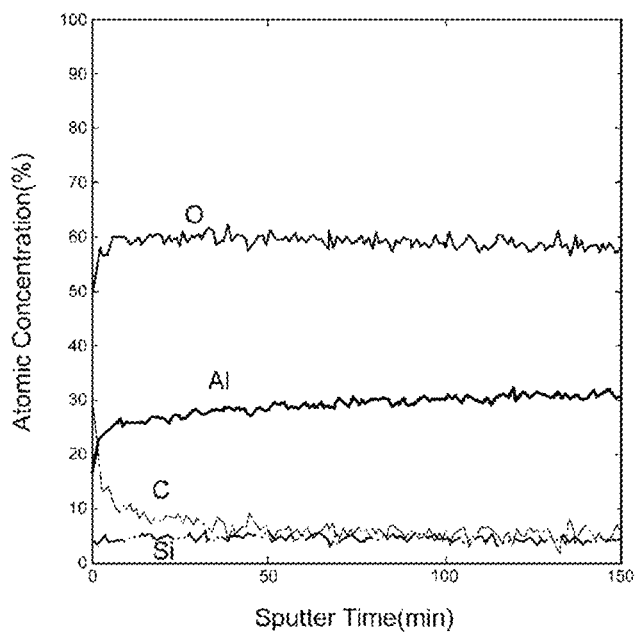
FIG. 3B is a graph illustrating the composition of a bonding surface of a base member after being irradiated with laser light.

FIG. 3A is a graph illustrating the composition of the bonding surface of the base member prior to being irradiated with laser light, and FIG. 3B is a graph illustrating the composition of the bonding surface of the base member after being irradiated with laser light. These graphs illustrate results obtained by measuring the types and amounts of elements present at the bonding surface of the base member using X-ray photoelectron spectroscopy (XPS). In these graphs, the vertical axis represents atomic concentration (%) and the horizontal axis represents sputtering time (min). The sputtering time refers to the time that the bonding surface of the base member is worn down by sputtering and corresponds to the depth from the bonding surface of the base member.

As shown in FIG. 3A, prior to irradiation with laser light, the concentration of oxygen decreases with increasing depth from the bonding surface of the base member and the concentrations of aluminum and nitrogen increase with increasing depth from the bonding surface of the base member.

On the other hand, as illustrated in FIG. 3B, after irradiation with laser light, oxygen is contained at around 60% and aluminum is contained at around 30% at all depths. From this, it can be taken as read that aluminum oxide is formed by the bonding surface of the base member being oxidized.

In addition, the surface roughness of the bonding surface 23 of the base member 20 is increased by the radiation of laser light. For example, the surface roughness of the bonding surface 23 of the base member 20 is higher than the surface roughness of the mounting surface of the base member 20 on which the light-emitting element 30 is mounted. It is thought that a rougher surface allows the organic structure 50 to fill and harden around the fine uneven parts of the bonding surface 23, and as a result a so-called anchor effect is generated in which the organic structure 50 is more firmly attached to the bonding surface 23 and the bonding strength between the bonding surface 23 and the organic structure 50 is increased.

Figure 4:
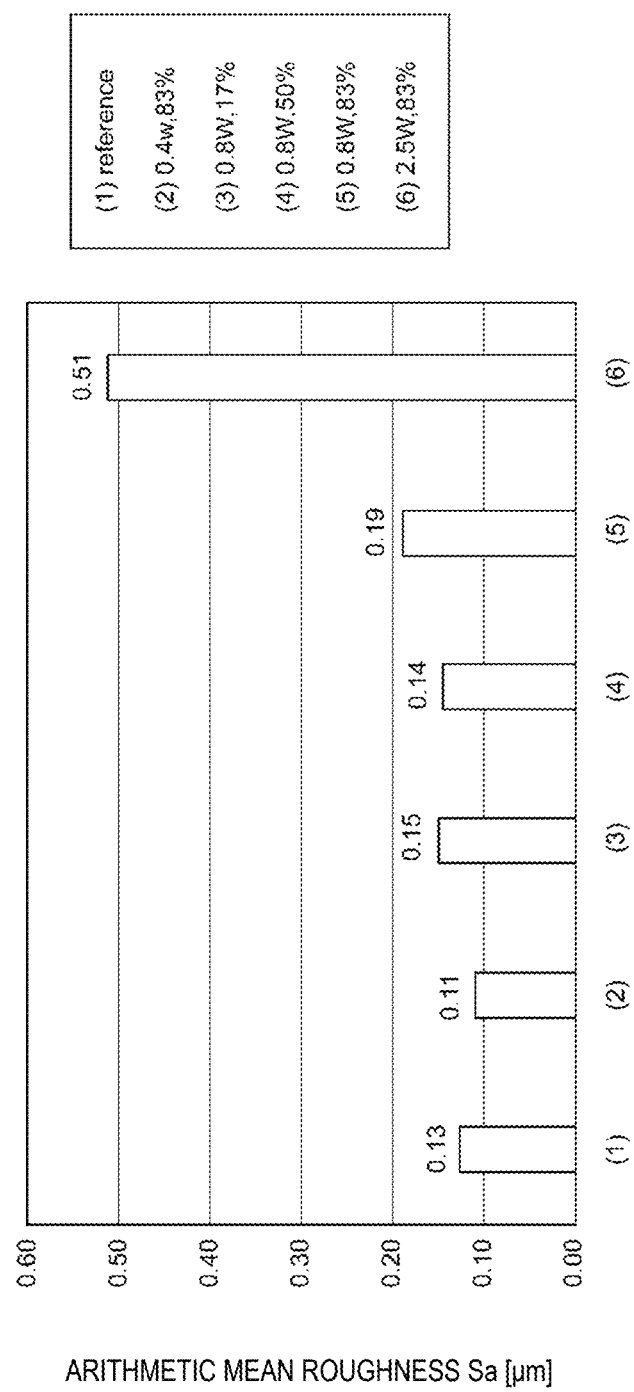
FIG. 4 is a graph illustrating the surface roughness of a bonding surface of a base member when laser light is radiated under various conditions.

FIG. 4 is a graph illustrating the surface roughness of the bonding surface of the base member when the laser light is radiated under various conditions. This graph illustrates surface roughness measured under conditions of (1) no laser light (comparative example) and conditions where the power (W) and the overlapping ratio (%) of the laser light were made to be (2) 0.4 W and 83%, (3) 0.8 W and 17%, (4) 0.8 W and 50%, (5) 0.8 W and 83%, and (6) 2.5 W and 83%. The overlapping ratio is a parameter that indicates the overlapping ratio of the laser spot in the next irradiation relative to the previous irradiation. The wavelength of the laser light is set to 532 nm, the spot diameter is set to 30 μm, and the repetition frequency is set to 20 kHz. In the graph, the vertical axis represents the arithmetic mean roughness Sa (μm).

Comparing (1) and (6) in the graph, it is clear that the arithmetic mean roughness Sa is increased, particularly under conditions of 2.5 W and 83%. It is deduced from the graph that the surface roughness of the bonding surface 23 increases as the intensity of the laser light increases.

Figure 5:
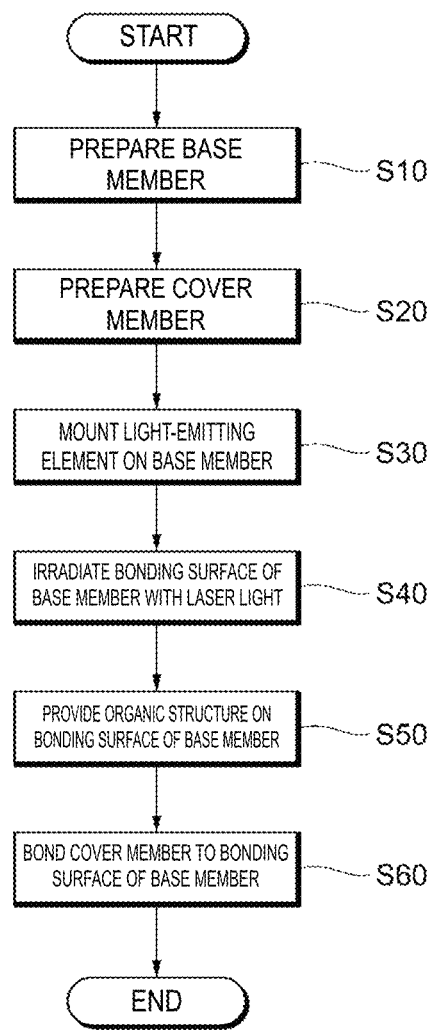
FIG. 5 is a flowchart illustrating a method of manufacturing a light-emitting device according to an embodiment of the present disclosure.

Next, a method of manufacturing the light-emitting device according to this embodiment will be described while referring to FIG. 5. FIG. 5 is a flowchart illustrating a method of manufacturing a light-emitting device according to an embodiment of the present disclosure. The order of the steps illustrated in FIG. 5 is an example and the order the steps may be changed.

First, the base member 20 formed of a material containing metal atoms is prepared (Step S10). As described above, the base member 20 may be an AlN substrate, for example. The AlN substrate is processed into the above-described shape by performing etching processing, for example.

Next, the cover member 40 is prepared (Step S20). As described above, the cover member 40 may be an artificial crystal, for example.

Next, the light-emitting element 30 is mounted on the mounting part 21 of the base member 20 (Step S30).

Next, the bonding surface 23 of the base member 20 is irradiated with laser light in an oxygen containing environment (Step S40). The bonding surface 23 of the base member is oxidized and aluminum oxide, which is an oxide, is formed by irradiating the bonding surface 23 with laser light. In addition, the surface roughness of the bonding surface 23 is increased by irradiating the bonding surface 23 with laser light. Parameters such as the intensity, wavelength, and spot diameter of the laser light may be adjusted in various ways as needed.

Next, the organic structure 50 is provided on the bonding surface of the base member (Step S50).

Finally, the cover member 40 is bonded to the bonding surface 23 of the base member 20 via the organic structure 50 (Step S60). Thus, the light-emitting element 30 is encapsulated inside the internal space formed by the base member 20 and the cover member 40.

As described above, in this embodiment, the bonding surface 23 of the base member 20 is oxidized prior to bonding the base member 20 and the cover member 40 to each other, and therefore hydroxyl groups are readily formed. Since the cover member 40 is bonded to the base member 20 by the organic structure 50, which readily bonds to hydroxyl groups, the bonding strength between the base member 20 and the cover member 40 can be improved while suppressing an increase in cost compared with a configuration in which bonding is realized using gold-tin, for example.

Furthermore, in this embodiment, since the surface roughness of the bonding surface 23 is increased using radiation of laser light, the bonding strength between the base member 20 and the organic structure 50 is also improved by the anchor effect.

In addition, the bonding surface 23 is oxidized by radiation of laser light in this embodiment, and therefore warping of the base member and so forth can be suppressed compared with a method in which the base member is oxidized using a heat treatment in an inert gas, for example. Furthermore, in this embodiment, a region that it is desired to oxidize can be locally irradiated with laser light, and therefore oxidation of the entire base member 20 can be avoided. It is not intended to exclude methods other than laser irradiation as a method of oxidizing the bonding surface 23, and the bonding surface 23 may be oxidized using heat treatment in an inert gas, for example.

After irradiating the bonding surface 23 with laser light, a modified layer may be provided on the bonding surface 23 by performing a silane coupling agent treatment. A modified layer in which many silane compounds remain is provided on the oxidized bonding surface 23 by the silane coupling agent treatment and the bonding strength between the base member 20 and the cover member 40 can be further increased.

In this embodiment, an example of adhesion has been described as a method of bonding the organic structure 50, but the method of bonding the organic structure 50 is not limited to adhesion and a bonding method such as heat fusion or ultrasonic welding may be used.

In this embodiment, a configuration has been described in which the base member 20 has a recess that houses the light-emitting element 30 and the cover member 40 is shaped like a flat plate, but the configuration of the holder is not limited to this, and, for example, the base member may be shaped like a flat plate and the cover member may have a recess that is open toward the base member.

In this embodiment, the light-emitting device 10 in which the light-emitting element 30 is housed is described as a specific example of an electronic device, but the present disclosure can be applied to an electronic device in which another electronic element such as an oscillator is housed instead of the light-emitting element 30.

The purpose of the embodiments described above is to enable easy understanding of the present disclosure and the embodiments are not to be interpreted as limiting the present disclosure. The present disclosure can be modified or improved without departing from the gist of the invention and equivalents to the present disclosure are also included in the present disclosure. In other words, appropriate design changes made to the embodiments by one skilled in the art are included in the scope of the present disclosure so long as the changes have the characteristics of the present disclosure. For example, the elements included in the embodiments and the arrangements, materials, conditions, shapes, sizes and so forth of the elements are not limited to those exemplified in the embodiments and can be changed as appropriate. In addition, the elements included in the embodiments can be combined as much as technically possible and such combined elements are also included in the scope of the present disclosure so long as the combined elements have the characteristics of the present disclosure.

REFERENCE SIGNS LIST

10 . . . light-emitting device,
20 . . . base member,
21 . . . mounting part,
22 . . . side wall part,
23 . . . bonding surface,
30 . . . light-emitting element,
40 . . . cover member,
50 . . . organic structure

The invention claimed is:

1. An electronic device comprising:
a base member made of a material containing metal atoms, the base member having a bonding surface, and the bonding surface containing oxides of the metal atoms;
an electronic element mounted on the base member;
an organic structure on the bonding surface of the base member; and
a cover member bonded to the bonding surface of the base member via the organic structure so as to encapsulate the electronic element in a space between the base member and the cover member.

2. The electronic device according to claim 1, wherein a surface roughness of the bonding surface of the base member is greater than a surface roughness of a mounting surface of the base member on which the electronic element is mounted.

3. The electronic device according to claim 1,
wherein the material containing the metal atoms includes aluminum nitride, and
the oxides include aluminum oxide.

4. The electronic device according to claim 1, wherein the cover member is an artificial crystal, synthetic quartz, or glass.

5. The electronic device according to claim 1, wherein the organic structure includes an epoxy resin adhesive, a silicone resin adhesive, or a hybrid resin adhesive containing a mixture of the epoxy resin adhesive and the silicone resin adhesive.

6. The electronic device according to claim 1, further comprising:
a modified layer on the bonding surface of the base member, the modified layer containing a silane compound.

7. The electronic device according to claim 1, wherein the electronic element is a light-emitting element.

8. The electronic device according to claim 1, wherein the organic structure includes an adhesive that contains one or more functional groups selected from an epoxy group, a silicone group, a vinyl group, a styryl group, a hydroxy group, a carboxyl group, a methacryloxy group, an acryloxy group, an amino group, an imino group, a cyano group, an amide group, an ureido group, an isocyanate group, and a siloxane group.

9. The electronic device according to claim 1, wherein the organic structure includes an inorganic filler.

10. The electronic device according to claim 9, wherein the inorganic filler is selected from silica, alumina, aluminum nitride, a metal powder, or a carbon-based material.

* * * * *